(12) United States Patent
Radi et al.

(10) Patent No.: US 9,385,084 B2
(45) Date of Patent: Jul. 5, 2016

(54) METAL PATTERN STRUCTURE HAVING POSITIONING LAYER

(71) Applicant: Wistron NeWeb Corp., Hsinchu (TW)

(72) Inventors: Babak Radi, Hsinchu (TW); Tzu-Wen Chuang, Hsinchu (TW); Shih-Hong Chen, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 0 days.

(21) Appl. No.: 14/825,184

(22) Filed: Aug. 13, 2015

(65) Prior Publication Data

US 2016/0141239 A1    May 19, 2016

(30) Foreign Application Priority Data

Nov. 14, 2014    (TW) .............................. 103220302 U

(51) Int. Cl.
| | | |
|---|---|---|
| *H01L 23/52* | (2006.01) | |
| *H01L 23/528* | (2006.01) | |
| *H01L 23/522* | (2006.01) | |
| *H01L 23/532* | (2006.01) | |

(52) U.S. Cl.
CPC .......... *H01L 23/528* (2013.01); *H01L 23/5223* (2013.01); *H01L 23/5227* (2013.01); *H01L 23/5228* (2013.01); *H01L 23/53204* (2013.01); *H01L 23/53228* (2013.01); *H01L 23/53233* (2013.01); *H01L 23/53242* (2013.01)

(58) Field of Classification Search
CPC ..... H01L 23/642; H01L 23/645; H01L 25/16; H01L 25/0652; H01L 23/5329; H01L 24/25; H01L 23/49555; H01L 24/03; H01L 24/05; H01L 24/06; H01L 24/11; H01L 24/16; H01L 24/48; H01L 24/73
See application file for complete search history.

(56) References Cited

U.S. PATENT DOCUMENTS

| | | | |
|---|---|---|---|
| 2007/0172690 A1* | 7/2007 | Kim | .................... B23K 35/0244 428/646 |
| 2008/0150623 A1* | 6/2008 | Lin | .................... H01L 23/49555 327/541 |
| 2010/0165585 A1* | 7/2010 | Lin | ........................ H01L 23/642 361/748 |

* cited by examiner

*Primary Examiner* — Selim Ahmed
(74) *Attorney, Agent, or Firm* — Jianq Chyun IP Office

(57) ABSTRACT

A metal pattern structure having a positioning layer thereon is provided. The positioning layer is located within a predetermined region of the metal pattern structure and located directly on the surface of a metal layer of the metal pattern structure.

10 Claims, 4 Drawing Sheets

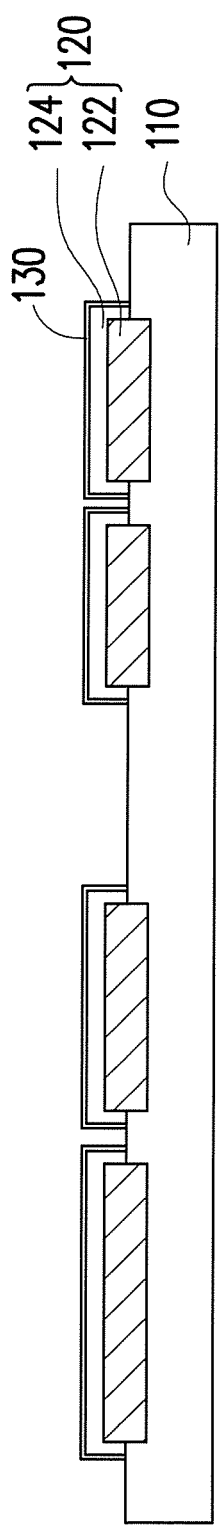
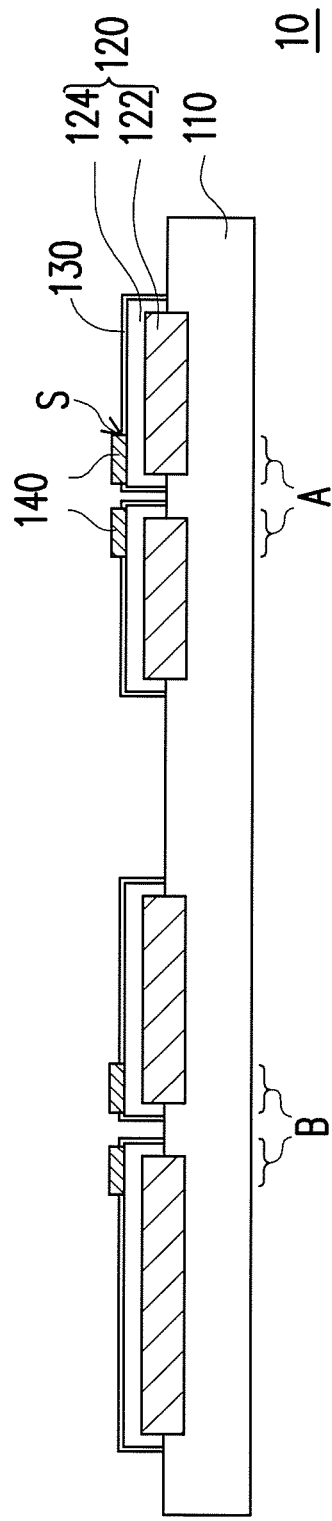
FIG. 1A
FIG. 1B

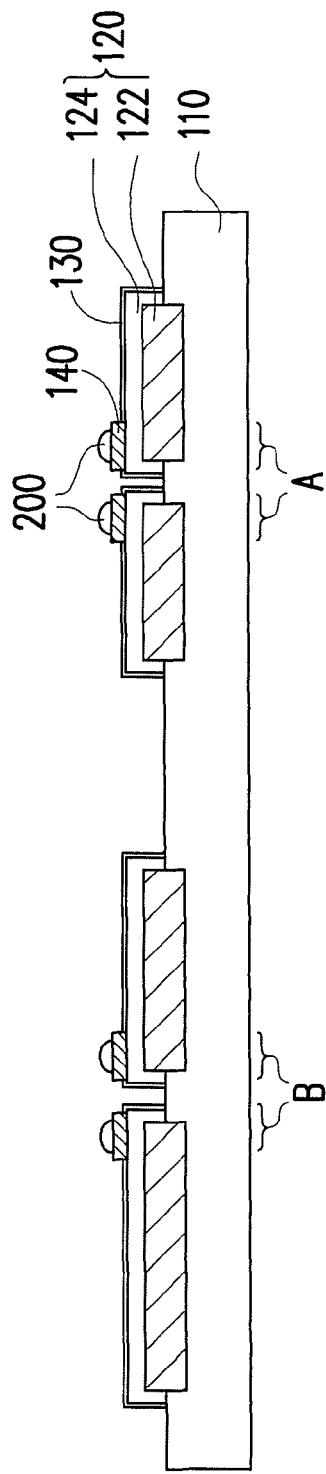
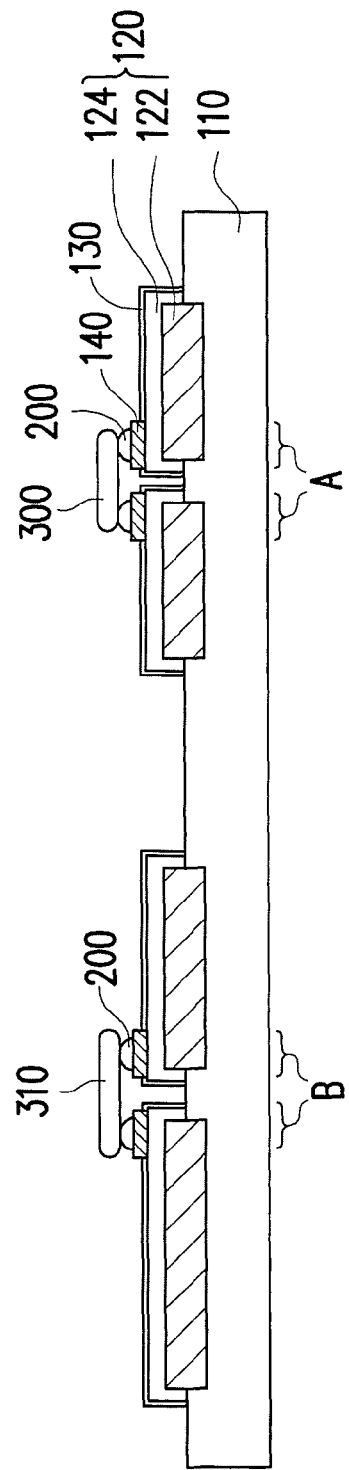

METAL PATTERN STRUCTURE HAVING POSITIONING LAYER

CROSS-REFERENCE TO RELATED APPLICATION

This application claims the priority benefit of Taiwan application serial no. 103220302, filed on Nov. 14, 2014. The entirety of the above-mentioned patent application is hereby incorporated by reference herein and made a part of this specification.

BACKGROUND OF THE INVENTION

1. Field of the Invention

The present invention generally relates to a semiconductor structure, in particular, to a metal pattern structure having a positioning layer.

2. Description of Related Art

Following the swift advances in communication technology, portable electronic devices such as smart phones, tablet PCs, notebook computers, etc., become more compact and handy for carrying. For achieving the miniaturization and for the efficiency of these small-sized devices, the portable electronic devices usually contain complex circuits, antenna structure(s) and various electronic components.

SUMMARY OF THE INVENTION

The present invention provides a metal pattern structure having a positioning layer thereon. The positioning layer is located within a predetermined region of the metal pattern structure and located directly on the surface of the metal layer of the metal pattern structure within a predetermined region.

The present invention provides a metal pattern structure. The metal pattern structure includes a metal pattern, a positioning layer and an organic protection layer. The metal pattern includes a first metal layer and second metal layer located on the first metal layer. The organic protection layer is located on the surface of the second metal layer having a predetermined region, and the organic protection layer covers the surface of the second metal layer without covering the predetermined region. The positioning layer is located within the predeterniined region and located directly on the surface of the second metal layer of the metal pattern.

In one embodiment of this invention, the first metal layer comprises a copper layer, and the second metal layer comprises a nickel layer.

In one embodiment of this invention, the metal pattern structure includes an antenna structure, the positioning layer comprises a gold layer or a conductive solderability preservative layer.

In one embodiment of this invention, the organic protection layer covering the second metal layer within the predeterniined region is removed by laser and a gold layer may be formed by the electroless plating process on the exposed second metal layer. The organic protection layer may be formed on the surface of the second metal layer by, for example, spray coating, rotation coating, dip coating, screen printing, pad printing or smearing.

In one embodiment of this invention, the material of the organic protection layer may be laser removable organic materials such as solder resist ink, or thiol compound.

By using the laser for treating, the positioning layer can be obtained with a very precise pattern or profile, so that the alignment and reliability of the soldering are enhanced. Also, because the untreated region of the metal pattern will not be plated, no plating chemicals will be wasted and the production cost is lowered.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A-1E are schematic cross-sectional views showing process steps for forming a positioning layer on a metal pattern structure and for soldering passive components on the positioning layer according to an embodiment of the present invention.

DESCRIPTION OF THE EMBODIMENTS

Figure 1E:
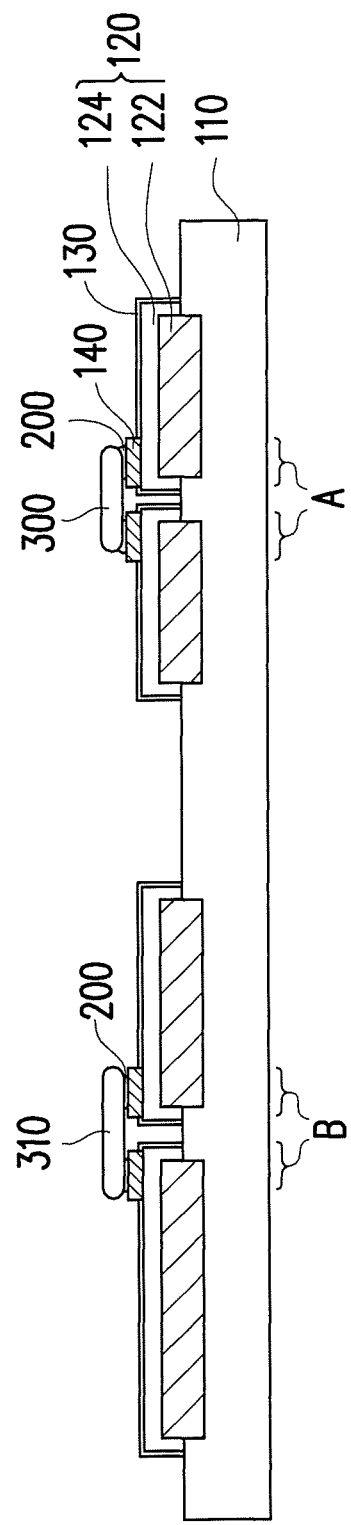

Reference will now be made in detail to the present preferred embodiments of the invention, examples of which are illustrated in the accompanying drawings. Wherever possible, the same reference numbers are used in the drawings and the description to refer to the same or like parts. In the following embodiment, a circuit trace part of a portable device is described as an example for illustration. It is not intended to limit the method or the part structure by the exemplary embodiments described herein.

This disclosure provides a metal pattern structure and the manufacturing method thereof. The metal pattern structure includes a metal pattern and a positioning layer locally formed directly on the surface of the metal pattern. Through laser treatment, the organic protection layer located on the surface of the metal pattern structure is partially removed to expose a specific region of the metal pattern structure, and the positioning layer is then formed at the specific region and on the surface of the metal pattern by an electroless plating process. The thin organic protection layer on the surface of the metal pattern structure can be partially removed according to a predetermined pattern within a predetermined region by directly applying laser to that region. No gold or metal layer will be formed in the region that was not treated by laser during a subsequent electroless plating process. Therefore, by processing through this approach, a positioning layer having a precise pattern and distinct boundaries can be formed in the predetermined region on the surface of the metal pattern structure via the electroless plating process.

In some embodiments, the metal pattern structure may be a nickel-containing metal laminated structure.

FIG. 1A-1E are schematic cross-sectional views showing process steps for forming a positioning layer on a metal pattern structure and for soldering passive components on the positioning layer according to an embodiment of the present invention.

Referring to FIG. 1A, a metal pattern 120 disposed on a substrate 110 located on an upper surface of the substrate 110 is provided. The substrate 110 may be a polymeric substrate, a plastic substrate, a metal or metallic casing or even a circuit board. Alternatively, the substrate 110 may be one or more components of an electronic device, and the electronic device may be, for example, a smart phone or a tablet computer. The metal pattern 120 may be an antenna element or a three-dimensional circuit incorporated in the electronic device. The metal pattern 120 of the embodiment may be an antenna pattern including a single metal layer or a multi-layered metal laminated pattern, the metal pattern 120 of the embodiment may be either a continuous pattern or a discontinuous pattern. The metal pattern 120 may be an antenna pattern containing a first metal layer 122 and a second metal layer 124, in which in the following embodiments the first metal layer 122 and the second metal layer 124 are illustrated as a copper layer 122 and a nickel layer 124, respectively. For example, the copper layer 122 is a copper pattern having a thickness of 6-20 microns and is constituted by copper or copper alloy, while the nickel layer 124 is a nickel pattern having a thickness of 3-8 microns. The metal pattern 120 is covered by an organic protection layer 130. Additionally, the material of the organic protection layer 130 can be solder resist ink, thiol compound or other organic compounds removable by laser, namely laser removable organic materials.

The organic protection layer 130 may be formed on the surface of the metal pattern 120 by, such as, spray coating, rotation coating, dip coating, screen printing, pad printing, or smearing. In general, the laser treatment can remove the organic protection layer from a specific, designated region.

Figure 2:
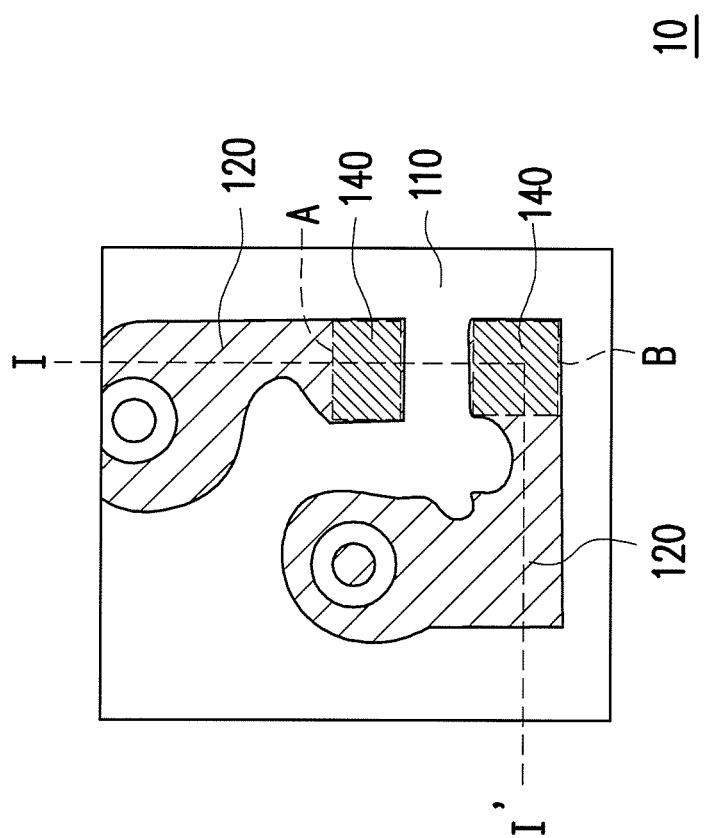
FIG. 2 is a schematic top view of the metal pattern structure according to an embodiment of the present invention.

Referring to FIGS. 1B & 2, a portion of the organic protection layer 130 is removed to form a pattern having at least one opening S, for instance, by a laser treatment. Then, a positioning layer 140 can be formed within the opening S of the pattern by a chemical process such as an electroless plating process.

In this embodiment, the laser treatment is applied to the predetermined regions A & B of the organic protection layer 130 to remove the organic protection layer 130 located within the predetermined regions A & B (to form a pattern having an opening S) thereby exposing the surface of the nickel layer 124 of the metal pattern structure 120. During the foregoing processing procedure of the laser treatment, within the treated region, the organic protection layer 130 is removed. The type of the laser to be used in the laser treatment depends on the material of the organic protection layer 130 used. The laser used in the laser treatment may be, for example, an infrared (IR) laser of a wavelength at 1064 nm. The pattern formed by partial removal of the organic protection layer 130 via the laser treatment is precise, and the location and therefore the shape of the subsequently formed positioning layer can also be precisely controlled. Besides, the region without laser treatment is still being covered by the organic protection layer 130 and therefore being protected from the external environment. As a result, the other region (i.e., the non-predetermined region) of the surface of the metal pattern 120 protected by the organic protection layer 130 during the subsequent electroless plating process will not react with the chemical plating solutions used. After the laser treatment step, the metal pattern 120 partially covered by the organic protection layer 130 will be immersed into an electroless plating solution to perform an electroless gold plating process. In the predetermined regions A & B, a positioning layer 140 is formed on the nickel layer 124 of the metal pattern exposed via the opening S. At this point, the metal pattern structure 10 includes the metal pattern 120, the organic protection layer 130, and the positioning layer 140 formed directly on the surface of the metal pattern 120.

In this embodiment, the nickel layer not protected by the organic protection layer is used as a seed pattern of the electroless gold plating process, so that the positioning layer 140 can be formed precisely within the predetermined regions A & B. In fact, the positioning layer 140 may be used as a bonding pad. Taking the electroless gold plating process as an example, the formed positioning layer 140 may be a gold pattern with a thickness of, for example, 0.2-1 microns, and the surface of the positioning layer 140 is slightly higher than the surface of the organic protection layer 130. The positioning layer 140 according to the present embodiment is composed of two discontinuous gold bonding pads (Figure not shown) located in the predetermined regions A & B.

In this embodiment and from another point of view, the positioning layer can be seen as being selectively plated on a specific region on the metal pattern 120. Accordingly, the present disclosure provides a way to avoid plating the entire surface of the metal pattern 120 with gold. The positioning layer 140 is selectively plated at the local region on the metal pattern 120 through laser treatment and by the protection of the organic protection layer. In addition, the positioning layer and/or the metal pattern can be formed with less material costs, and the manufacturing process can also be less trivial thereby simplifying the overall manufacturing process. Additionally, less molds and fixtures will be used as well.

Specifically, by using the organic protection layer and the laser treatment, the region where the pattern is to be formed on is activated by laser, so as to ensure the positioning layer is formed at the predetermined position during the electroless plating process. Hence, the location where the positioning layer is formed is very precise. Moreover, since the laser untreated region is not affected by electroless plating, the chemical immersion solutions will not be wasted and the production cost can thereby being lowered.

By processing through the laser treatment, the pattern or profile of the positioning layer can be precisely obtained. Because laser treatment is capable of being applied to designated shapes or profiles on different metal materials or structures, the positioning layer can be precisely formed on a flat surface or non-planar structures as well.

Referring to FIGS. 1C-1E, a solder paste 200 is disposed on the positioning layer 140 in the predetermined regions A & B by, for instance, spray coating, dispensing or printing. Then, surface mount technology (SMT) will be applied for respectively mounting the passive components 300 and 310 onto the solder paste 200 on the positioning layer 140 within the predetermined regions A & B. Then, a reflow process is performed to melt the solder paste 200, and the passive components 300 and 310 will be firmly adhered to the positioning layer 140 within the predetermined regions A & B. It is worth to be mentioned that, the melted solder paste 200 is spontaneously restrained within the area of the positioning layer 140 and will not overflow out of the area of the positioning layer 140, thereby providing self-alignment or self-correction for shifted or misaligned solder paste. As a result, the soldering offset of the passive elements 300 and 310 can be reduced or recovered. Additionally, the bonding between the component and the solder paste can also be reinforced, thereby strengthening the bonding between the component and the solder paste. The passive components 300 and 310 may be capacitors, resistors or inductors, etc.

FIG. 2 is a schematic top view of the metal pattern structure according to an embodiment of the present invention. FIG. 2 simply shows a portion of the positioning layer on the metal pattern structure. The portion of the metal pattern structure shown in FIG. 2 may be a part of an antenna structure. Such antenna structure may be a magnetic induction antenna or a near field communication (NFC) antenna, and its size and shape may be modified based on how it is designed. In this embodiment, the total thickness of the metal pattern 120 may be less than about 50 microns; thinner metal antenna structures may be more capable of being used with flexible substrates, and together to be incorporated into the peripherals of mobile or communication devices.

The metal pattern structure 10 shown in FIG. 2 is similar to the metal pattern structure of the foregoing embodiment (shown in FIG. 1B). The metal pattern structure 10 includes the metal pattern 120, the organic protection layer 130 and the positioning layer 140 formed directly on the surface of the metal pattern 120. By referring to the foregoing detailed embodiments, the metal pattern 120, for example, may be an antenna pattern composed of a laminate of the copper layer 122 and the nickel layer 124. The copper layer 122 may be a copper pattern constituted by copper or copper alloy. The thickness of the copper layer 122 can be 6-20 microns. The nickel layer 124 may be a nickel pattern having a thickness of 3-8 microns. The metal pattern 120 is covered by an organic protection layer 130. Since the organic protection layer 130 is very thin, in order to show relative positions and configurations between the positioning layer 140 and the metal pattern 120, the organic protection layer 130 is omitted in FIG. 2. Nonetheless, the organic protection layer 130 is still covering the surface of the metal pattern 120 outside the location of the positioning layer 140. The positioning layer 140 located on the metal pattern 120 in the predetermined regions A & B may be a gold pattern having a thickness of 0.2-1 microns. The surface of the positioning layer 140 is slightly higher than the surface of the organic protection layer 130. The positioning layer 140 according to the present embodiment includes two separate gold bonding pads located in the predetermined regions A & B.

While comparing to conventional manufacturing processes as plating the positioning layer over the entire surface of the metal pattern, the positioning layer of the present invention is selectively and precisely formed within a designated region on the surface of the metal pattern structure. Furthermore, the positioning layer can be used to limit the distribution area of the solder paste in the subsequent soldering/reflow process, so that the alignment and bonding strength of the soldering are greatly enhanced. Further it is much more cost effective without plating the positioning layer over the entire area. The positioning layer selectively plated on specific local region(s) can prevent or limit overflow of the solder paste, so that self-alignment of the solder paste may be achieved or the unwanted soldering offset may be alleviated.

The metal pattern structure of the present disclosure may be suitable to be used in portable electronic or communication products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal pattern structure having a positioning layer, the metal pattern structure comprising:
   a metal pattern having a first metal layer and a second metal layer located on the first metal layer, wherein the second metal layer covers sidewalls of the first metal layer and the second metal layer comprises nickel;
   an organic protection layer attached to the surface of the second metal layer and having a predetermined region, wherein the organic protection layer covers the surface of the second metal layer except for the predetermined region, the second metal layer is exposed by the predetermined region, and a material of the organic protection layer is thiol compound; and
   a positioning layer located and confined within the predetermined region and located directly on the surface of the second metal layer exposed by the predetermined region, wherein the positioning layer is a gold layer capable of positioning a solder paste thereon.

2. The metal pattern structure of claim 1, wherein the first metal layer comprises a copper layer.

3. The metal pattern structure of claim 1, wherein the first metal layer is a copper pattern formed by copper or copper alloy having a thickness of 6-20 microns, and the second metal layer is a nickel pattern having a thickness of 3-8 microns.

4. The metal pattern structure of claim 1, wherein the metal pattern comprises an antenna structure.

5. The metal pattern structure of claim 1, further comprising at least one passive component fixed on the positioning layer.

6. The metal pattern structure of claim 5, further comprising a solder paste located on the positioning layer and between the passive component and the positioning layer thereby fixing the passive component to the positioning layer.

7. The metal pattern structure of claim 5, wherein the passive component includes a capacitor, a resistor or an inductor.

8. The metal pattern structure of claim 1, wherein the thickness of the first metal layer is larger than the thickness of the second metal layer.

9. The metal pattern structure of claim 1, wherein the first metal layer is partially embedded and the second metal layer covers sidewalls and the top surface of a non-embedded portion of the first metal layer.

10. The metal pattern structure of claim 1, wherein the top surface of the positioning layer is higher than the top surface of the organic protection layer.

\* \* \* \* \*